United States Patent
Itou et al.

(10) Patent No.: US 8,184,447 B2
(45) Date of Patent: May 22, 2012

(54) MULTI-LAYER ELECTRONIC PART BUILT-IN BOARD

(75) Inventors: Dai Itou, Anjo (JP); Tooru Itabashi, Anjo (JP)

(73) Assignee: DENSO CORPORATION, Kariya (JP)

( * ) Notice: Subject to any disclaimer, the term of this patent is extended or adjusted under 35 U.S.C. 154(b) by 1203 days.

(21) Appl. No.: 11/984,325

(22) Filed: Nov. 15, 2007

(65) Prior Publication Data
US 2008/0117609 A1    May 22, 2008

(30) Foreign Application Priority Data
Nov. 16, 2006 (JP) .................. 2006-310578

(51) Int. Cl.
*H05K 1/18* (2006.01)

(52) U.S. Cl. ........ 361/761; 361/764; 361/785; 361/794; 361/795

(58) Field of Classification Search .......... 361/763–766, 361/785, 792–795
See application file for complete search history.

(56) References Cited

U.S. PATENT DOCUMENTS

| | | | |
|---|---|---|---|
| 5,432,677 A * | 7/1995 | Mowatt et al. ................ | 361/719 |
| 6,198,362 B1 | 3/2001 | Harada et al. | |
| 6,865,089 B2 * | 3/2005 | Ho et al. ....................... | 361/761 |
| 7,180,749 B2 | 2/2007 | Tsukahara et al. | |
| 7,495,880 B2 * | 2/2009 | Makino et al. ................ | 361/212 |
| 2003/0024732 A1 | 2/2003 | Ninomiya | |
| 2004/0012935 A1 | 1/2004 | Tagi et al. | |
| 2005/0047032 A1 | 3/2005 | Kanayama et al. | |
| 2006/0087821 A1 | 4/2006 | Makino et al. | |
| 2007/0114058 A1 | 5/2007 | Tsukahara et al. | |
| 2007/0119617 A1 | 5/2007 | Hayashi et al. | |
| 2007/0137890 A1 | 6/2007 | Tagi et al. | |

FOREIGN PATENT DOCUMENTS

| | | |
|---|---|---|
| JP | A-H1-207992 | 8/1989 |
| JP | A-H2-121393 | 5/1990 |
| JP | A-H7-95658 | 4/1995 |
| JP | A-H9-74276 | 3/1997 |
| JP | A-H11-233951 | 8/1999 |
| JP | A-H11-261238 | 9/1999 |
| JP | A-2000-91784 | 3/2000 |
| JP | A-2005-72954 | 3/2005 |
| JP | A-2005-243850 | 9/2005 |

OTHER PUBLICATIONS

Office Action mailed Jun. 7, 2011 in corresponding JP application No. 2006-310578 (and English translation).
Office Action mailed Mar. 6, 2012 in corresponding JP Application No. 2006-310578 (and English translation).

* cited by examiner

*Primary Examiner* — Tuan T Dinh
(74) *Attorney, Agent, or Firm* — Posz Law Group, PLC

(57) ABSTRACT

A versatile multi-layer electronic part built-in board compatible with different external circuits to be connected thereto is provided. Sensors are connected to a connector through connection lines that are connected to electronic parts. The electronic parts are directly connected to the connector and can be mounted on the top layer, the bottom layer or both the top and bottom layers of the multi-layer electronic part built-in board. When the sensor to be connected, for example, is changed to another having a different characteristic, an electronic part mounted on the top and bottom layers correspondingly to the sensor can be changed.

7 Claims, 11 Drawing Sheets

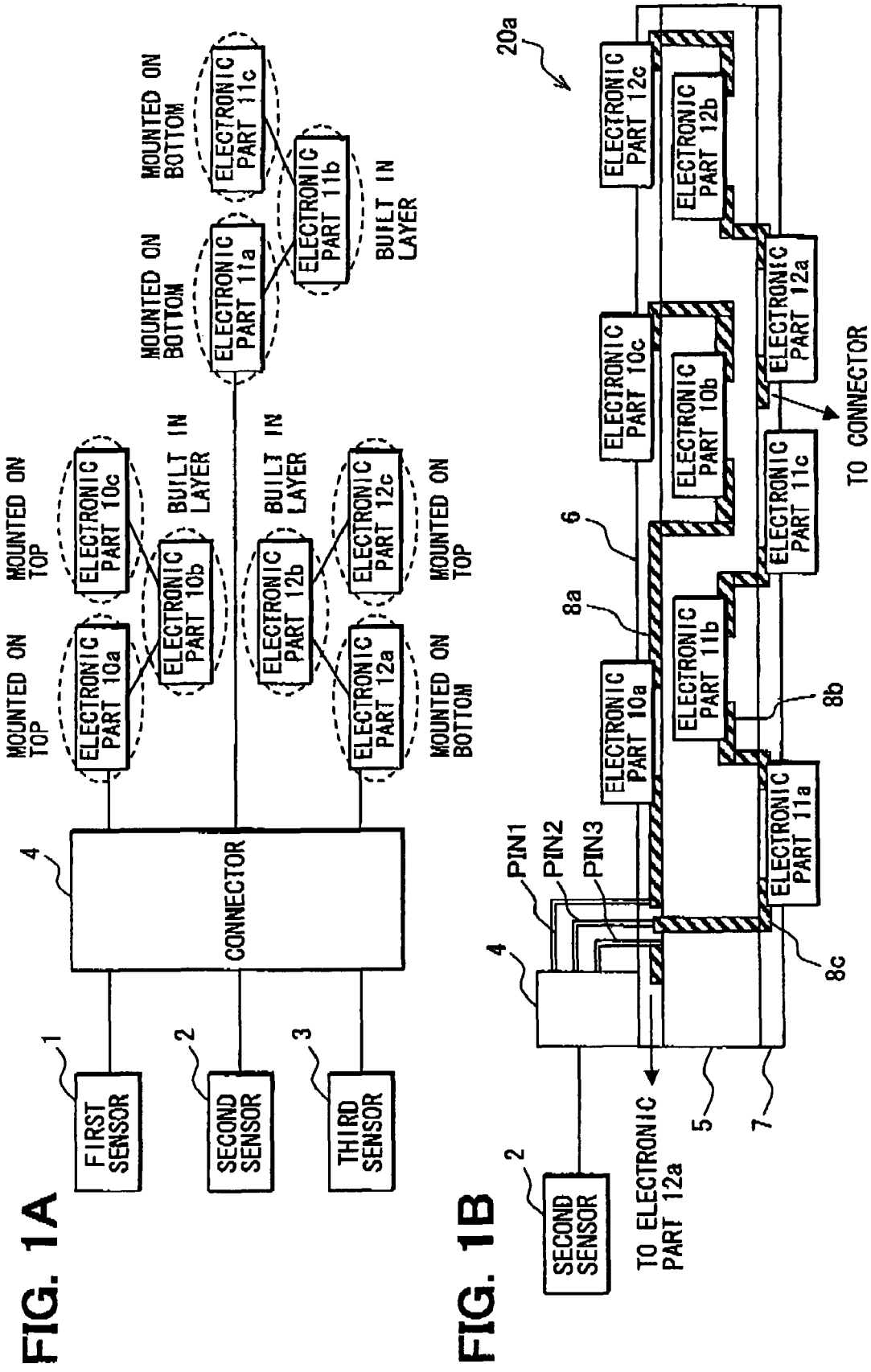

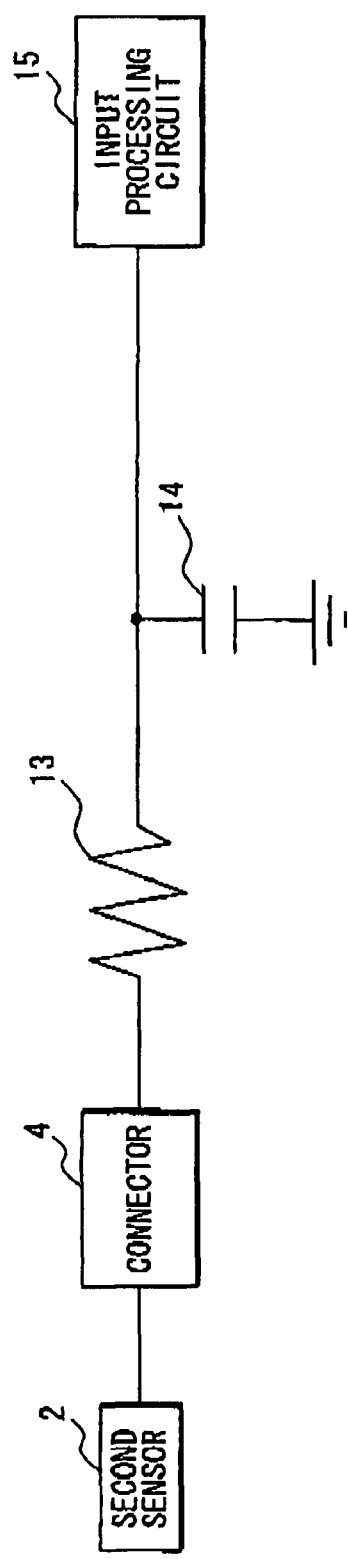
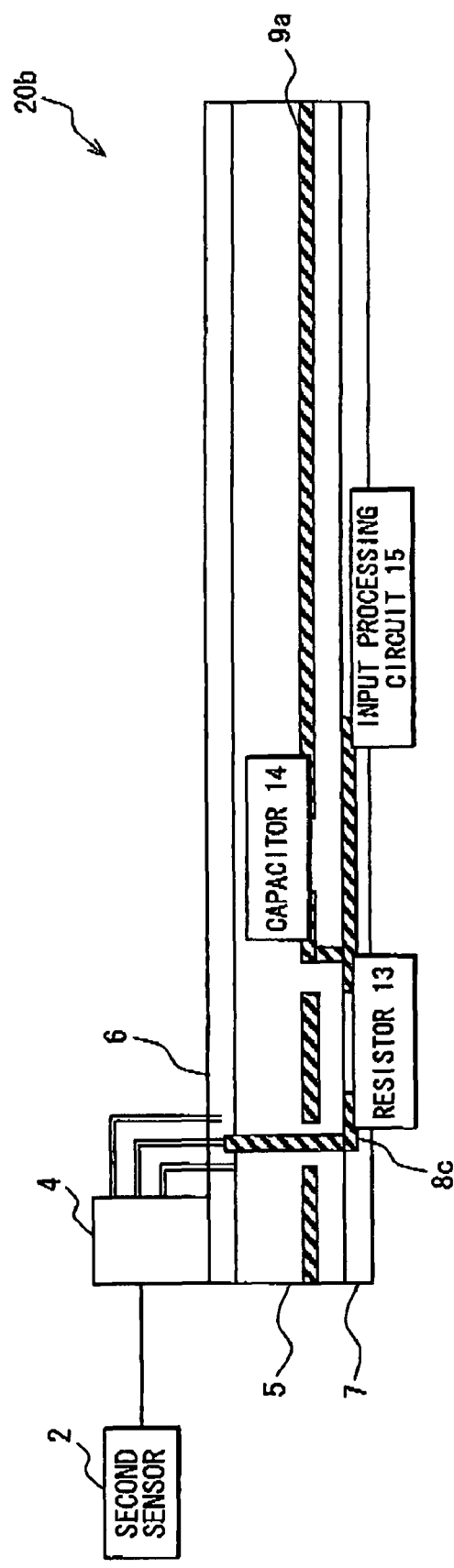

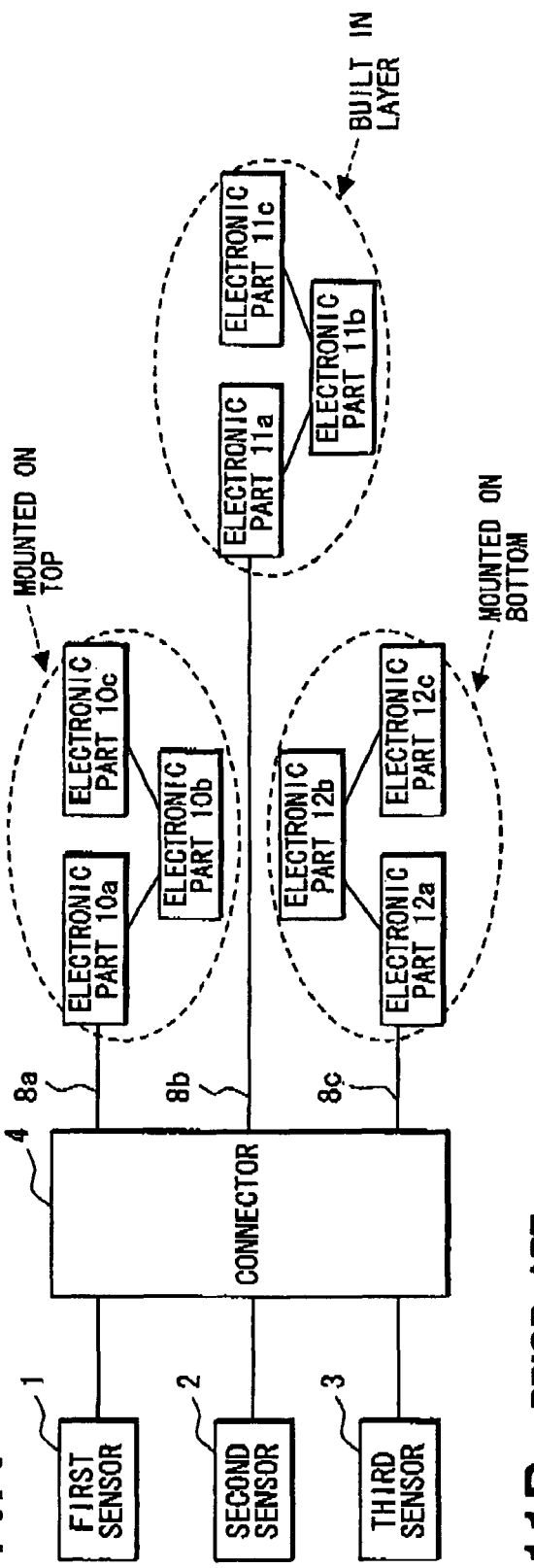
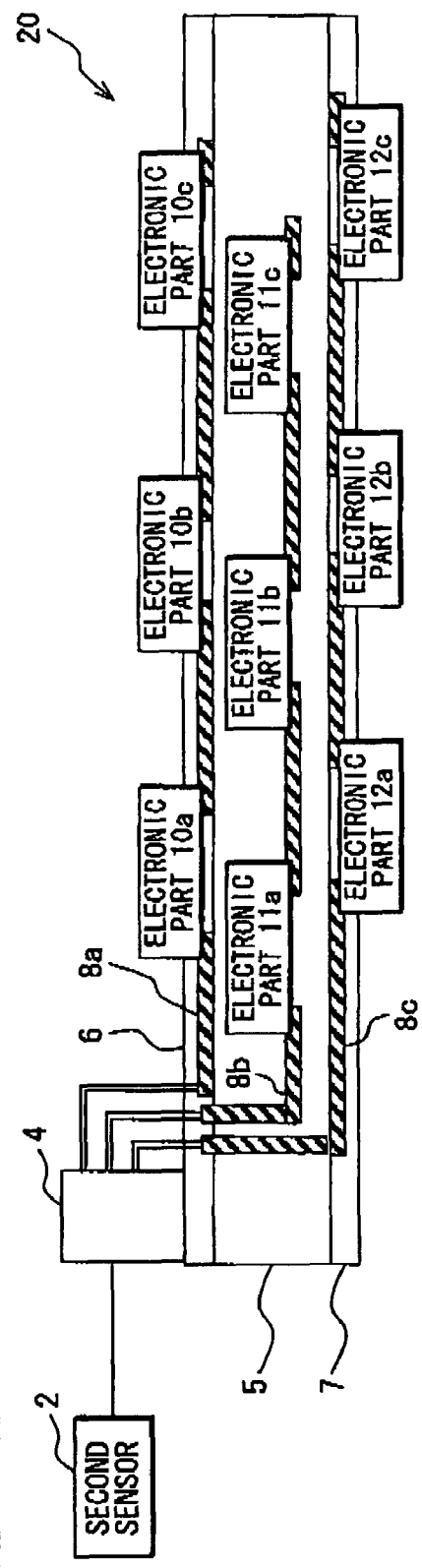
FIG. 11A PRIOR ART
FIG. 11B PRIOR ART

MULTI-LAYER ELECTRONIC PART BUILT-IN BOARD

CROSS-REFERENCE TO RELATED APPLICATIONS

The present application is based on and claims priority to Unpublished Japanese Patent Application No. 2006-310578 the contents of which are incorporated herein by reference.

BACKGROUND OF THE INVENTION

1. Field of the Invention

The present invention relates to a multi-layer electronic part built-in board, and more specifically to a multi-layer electronic part built-in board that includes alternately layered conductive and insulating layers and is mounted with built-in electronic parts.

2. Description of Background Art

Electronic control devices used in daily life, such as in vehicles and in home electric appliances are becoming increasingly sophisticated. While the scope of the circuitry included in the typical electronic control apparatus is expanding, there is a concurrent and increasing need for miniaturizing the device or apparatus itself including making the apparatus or device thinner. Accordingly, special attention is paid to the multilayer board as a circuit board suitable for satisfying the expanding needs for use in the electronic control apparatus. The multi-layer board can have surface layers and one or more internal layers that form wring layers and can contain built-in electronic parts. Since electronic parts are built into the board, the area required for mounting electronic parts on the surface can be reduced, which is advantageous for miniaturization.

In accordance with, for example, Japanese Patent Unexamined Publication No. 2005-243850, a multi-layer printed circuit board includes built-in electronic parts. A first wiring pattern is formed on the surface. The multi-layer printed circuit board has a core material where a non through hole is formed. An electronic part is embedded and fixed in the non through hole of the core material. An inter-layer insulating layer is then provided for both sides of the core material so as to embed the electronic part and the first wiring pattern. A second wiring pattern is connected to an electronic part electrode and is formed on the inter-layer insulating layer. Since the electronic part is placed in the non through hole of the core material, the multilayer printed circuit board can be miniaturized and thinned.

As will be described in detail hereinafter, it is virtually impossible to change a built-in electronic part once it is contained in the multi-layer board. As a result, the multi-layer board lacks versatility since, for example, it cannot be connected to different external circuits.

As shown in connection with the conventional configuration illustrated in FIG. 11A and FIG. 11B, it is assumed that a multi-layer electronic part built-in board 20 is supplied with detection signals from three different sensors such as first sensor 1 through third sensor 3, as external circuits and processes the signals. The first sensor 1 through the third sensor 3 are connected to lands on the surface of the multi-layer board 20 through a connector 4 provided for the multi-layer board 20. The lands are connected to a wiring pattern 8a on a top layer, a wiring pattern 8b on an internal layer, and a wiring pattern 8c on a bottom layer.

The multi-layer board 20 is configured as a layered body 5. The layered body 5 includes a glass epoxy resin as an insulator, for example, and an alternate layer of the wiring patterns 8a, 8b, and 8c where a copper foil is patterned as a conductive layer. The top layer and the bottom layer of the layered body 5 are provided with resist films 6 and 7, respectively. The resist films 6 and 7 protect and insulate the wiring patterns 8a and 8c formed on the top layer and the bottom layer.

The top and bottom layers of the multi-layer board 20 are mounted with electronic parts 10a through 10c and 12a through 12c. The internal layer of the multi-layer board 20 contains electronic parts 11a through 11c.

The electronic parts 10a through 10c, 11a through 11c, and 12a through 12c filter, amplify, or analog-to-digital convert signals supplied from the first sensor 1 through the third sensor 3. The microcomputer may perform a specified operation based on the sensor signals.

Of the electronic parts 10a through 10c, 11a through 11c, and 12a through 12c, the electronic parts 11a through 11c are connected to the second sensor 2 and are contained in the internal layer of the multi-layer board 20 as shown in FIG. 11A and FIG. 11B. The electronic parts 11a through 11c cannot be changed virtually.

The same multi-layer board 20 cannot be used for the second sensor 2 that may feature different characteristics such as responsiveness and detection sensitivity. The multi-layer board 20 becomes less versatile.

SUMMARY OF THE INVENTION

The present invention has been made in consideration of the foregoing. It is therefore an object of the present invention to provide a versatile multi-layer electronic part built-in board compatible with different external circuits to be connected.

To achieve the above-mentioned object, a multi-layer electronic part built-in board includes a connector for connecting with an external circuit. The connector has multiple connection lines for connecting with multiple external circuits. Each of the connection lines is used to electrically connect an electronic part group including multiple electronic parts. At least one electronic part in the electronic part group is mounted on one of a top layer and a bottom layer of the multi-layer board.

The connection lines connect with electronic parts belonging to an electronic part group. At least one electronic part is mounted on one of the top layer and the bottom layer of the multi-layer board. In the above described manner, in association with each external circuit, it can be ensured that at least one electronic part is mounted on the top layer and the bottom layer of the multi-layer board. When a different external circuit is to be connected, only the electronic part mounted on the top layer or the bottom layer corresponding to the external circuit needs to be changed. For example, the same multi-layer electronic part built-in board can be used for input processes of a sensor having different characteristics by changing electronic parts associated with, for example, the time constant of a filtering process or an the amplification level of an amplifying process, or the like. As a result, the same multi-layer electronic part built-in board can be used with versatility.

According to one of several configurations to be described in the paragraphs below, the electronic part group includes a first electronic part directly connected to the connector and a second electronic part indirectly connected to the connector via the first electronic part. The first electronic part is mounted on one of the top layer and the bottom layer of the multi-layer board. The second electronic part is built in the multi-layer board such as in an internal layer since, in many cases, it is most effective to change the first electronic part directly connected to the external circuit when the external circuit is changed to another with different characteristics.

According to one of various other configurations to be described hereinafter, the conductive layer includes a wiring layer formed with a wiring pattern for transmitting a signal and a ground layer for specifying a ground potential. The second built-in electronic part connects the wiring pattern with the ground layer and is provided for the ground layer. When the wiring layer is densely provided with a wiring pattern, it may be difficult to place an electronic part on the wiring layer. Ensuring a region for placing the electronic part accordingly increases the board area. Some electronic parts can be placed on not only the wiring layer but also the ground layer. Placing such electronic parts on the ground layer can increase the number of electronic parts to be arranged on the wiring layer and prevent the board area from increasing.

A ground wiring pattern of the ground layer is divided into multiple portions and contains a capacitor for connecting divided ground patterns with each other. The ground layer supplies a ground potential to all electronic parts and circuits formed on the multi-layer board. Generally, only one ground layer is provided for the multi-layer board. When the multi-layer board includes a large current circuit, i.e., a possible source of the noise, it is preferable to prevent noise from entering a signal processing circuit by separating a ground pattern for the large current circuit from that for the normal signal processing circuit. Noise generated by the large current circuit contains a relatively low-frequency component. The noise hardly causes a ground potential to be unstable even when the ground wiring pattern of the ground layer is divided. When the multi-layer board also includes a high-frequency oscillation circuit, however, the undivided ground wiring pattern keeps a ground potential stable against high-frequency noise generated from the high-frequency oscillation circuit. As described in claim 4, the ground layer is divided into multiple ground patterns. The capacitor is used to connect the divided ground patterns with each other. The divided ground patterns become electrically conductive, keeping the ground potential stable even when high-frequency noise occurs.

In another configuration, a ground pattern of the ground layer includes a slit and further contains a capacitor for connecting ground patterns with each other at both sides of the slit. When the multi-layer board includes a relatively low-frequency clock circuit, noise may enter the ground pattern for the signal processing circuit from the ground pattern for the dock circuit. To prevent the noise, a slit is provided between both ground patterns. As mentioned above, however, the undivided ground wiring pattern can keep the ground potential stable against high-frequency noise. The capacitor is used to connect the ground patterns at both sides of the slit. Both ground patterns become electrically conductive against high-frequency noise.

The conductive layer further includes a power supply layer supplied with a power supply potential and contains a capacitor for connecting the power supply layer with the ground layer. When the capacitor is built in, it is possible to minimize a distance from the capacitor to the power supply layer and the ground layer. The capacitor can be used to stabilize the power supply and decrease an impedance.

The ground layer is provided with a ground pattern between multiple electronic parts provided for the ground layer. The ground layer may have a hole for connecting electronic parts placed on the ground layer with one or more wiring layers through via holes. The hole becomes bigger as the number of electronic parts increases. The hole bottlenecks a path for a current flowing to the ground pattern. The current may need to take a long detour. When electronic parts are provided for the ground layer, it is preferable to avoid making a continuous large hole in the ground pattern. Instead, the ground pattern is provided between the electronic parts so that each part has its own hole independent of the others, making it possible to shorten the route for a current flowing to the ground pattern.

The ground layer is provided adjacent to the power supply layer. An electronic part is provided for each of the ground layer and the power supply layer. An electronic part is provided on both sides of the ground layer opposite the power supply layer. An electronic part is provided for both sides of the power supply layer opposite the ground layer. Electronic parts are provided for the ground layer and the power supply layer at displaced positions in a layering direction of the multi-layer board. In the above described manner, electronic parts can be placed on the ground layer and the power supply layer without increasing a board thickness.

The above described configurations of the ground layer can be applied to the power supply layer and can provide almost the same working effects as those mentioned above. Therefore, a more detailed description is omitted in the present section for simplicity.

An electronic part provided on one of the top layer and the bottom layer of the multi-layer board is a filter part for allowing only a signal of a specified frequency band to pass. A shield pattern is further provided in a layer between the filter part and a built-in electronic part and prevents interference associated with a signal from the filter part to be coupled to the built-in electronic part and vice versa. As the state of the art in high-density packaging develops, the multi-layer board may contain other electronic parts immediately below the filter part. Since the filter circuit is supplied with an unfiltered signal containing many noise components that may couple into the immediately underlying built-in electronic part from the filter circuit, a shield pattern is provided between the filter circuit and the immediately underlying electronic part to prevent noise from being transmitted from the filter circuit.

The filter part is a common mode choke coil for attenuating common mode noise signals. Since the multi-layer board may configure a communication circuit for communicating with an external circuit, a common mode choke coil is effective. In addition, use of the choke coil allows transmission of a communication signal in a differential mode.

The conductive layer includes a ground layer for specifying a ground potential. The shield pattern is connected to the ground layer. When the shield pattern is connected with the ground layer, the shield pattern can more effectively prevent coupling of a noise signal into shielded circuits.

The electronic part group includes a communication circuit for communicating with multiple external circuits. An electronic part mounted on one of the top layer and the bottom layer of the multi-layer board forms a terminal circuit including a terminal resistor for a communication line connected to the communication circuit. When the communication line connects multiple external circuits each having the communication circuit, the end of the communication line is generally provided with a terminal circuit including a terminal resistor. The terminal resistor prevents the reflection of a signal at the end or terminal portion of a wiring section and consequently prevents the disruption of signals propagating on the communication line by the reflected component. It should be noted that not all communication circuits are provided with the terminal circuit including the terminal resistor. Therefore an electronic part for the terminal circuit can be mounted on the top layer and bottom layer of the multi-layer board so that the terminal circuit can be mounted or detached as needed.

The multi-layer electronic part built-in board is applied as an internal structure of a module device mounted on a mother board. A yield may decrease when a large-sized mother board is structured in compliance with the above-mentioned multi-layer board. To solve the above described problem, the multi-layer board structures are applied to not the mother board, but a module device provided for it makes it possible to miniaturize the mother board and prevent a yield from decreasing.

The module device forms a communication circuit for communicating with multiple external circuits. Modularizing the communication circuit can separate it from the circuit configuration of the mother board. The mother board can be less susceptible to an effect of noise emitted from the communication circuit. Further, the communication circuit can be less susceptible to an effect from the other circuits on the mother board.

BRIEF DESCRIPTION OF THE DRAWINGS

The above and other objectives, features and advantages of the present invention will become more apparent from the following detailed description made with reference to the accompanying drawings. In the drawings:

FIG. 1A is a block diagram illustrating electronic parts associated with an exemplary multi-layer electronic part built-in board according to a first embodiment;

FIG. 1B is a diagram illustrating the electronic parts in FIG. 1A built on surface layers and in an internal layer of an exemplary multi-layer board;

FIG. 2A is a circuit diagram illustrating an exemplary circuit according to a second embodiment for connection with a second sensor;

FIG. 2B is a diagram illustrating the electronic parts shown in FIG. 2A built on surface layers and in an internal layer of an exemplary multi-layer board;

FIG. 11A is a block diagram illustrating electronic parts associated with an exemplary multi-layer electronic part built-in board according to the prior art; and FIG. 11B is a diagram illustrating the electronic parts in FIG. 11A built on surface layers and in an internal layer of a multi-layer board.

DETAILED DESCRIPTION OF THE EXEMPLARY EMBODIMENTS

First Embodiment

Figure 3A:
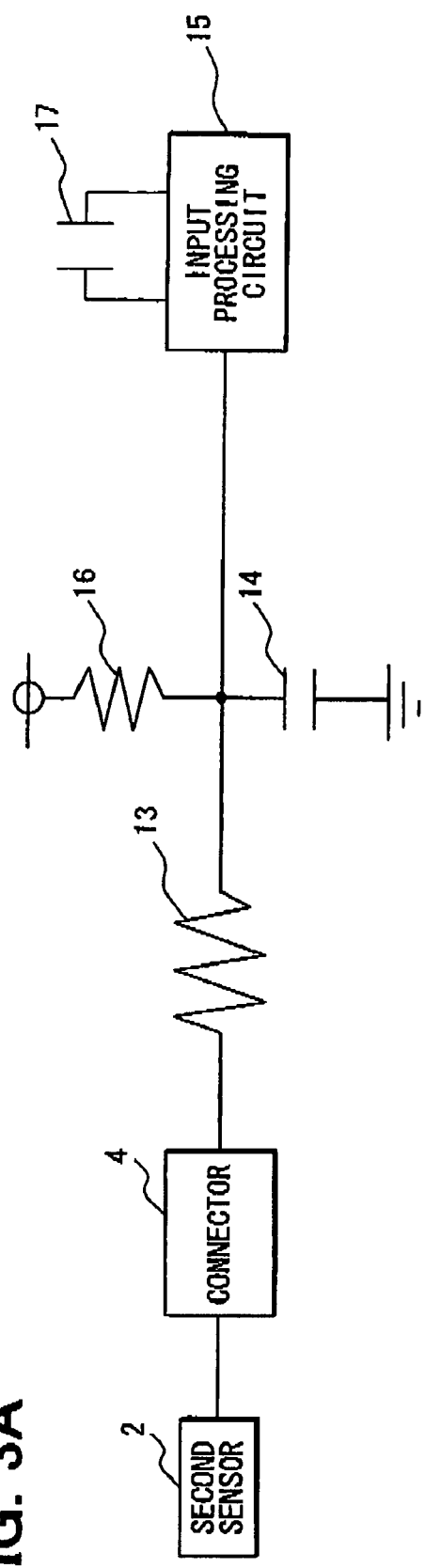
FIG. 3A is a circuit diagram illustrating an exemplary circuit according to a third embodiment connection with the second sensor.

A multi-layer electronic part built-in board according to a first embodiment of the present invention will be described with reference to the accompanying drawings. It should be noted that mutually corresponding parts of the multi-layer electronic part built-in board, for example in FIG. 11A, FIG. 11B, and in the other drawings are designated herein by using the same reference numerals. Therefore, a detailed description, where an element having the same reference numeral as one from a previously described figure appears in a different figure, is omitted for simplicity in connection with the description of the different figure.

In FIG. 1A, an example of connecting electronic parts on a multi-layer electronic part built-in board 20a according to a first embodiment is shown. FIG. 1B shows how, for example, electronic parts in FIG. 1A are mounted on the top and bottom surfaces of the multi-layer board 20a and are built in an internal layer. As shown in FIG. 1A and FIG. 1B, the multi-layer electronic part built-in board 20a according to the present embodiment has a similar basic configuration as that of the multi-layer electronic part built-in board 20 in FIG. 11A and FIG. 11B.

The multi-layer board 20a has a layered body 5. The layered body 5 includes an insulator of glass epoxy resin as and an alternate layer of the wiring patterns 8a, 8b, and 8c where, for example, a copper foil is patterned as a conductive layer. The insulator may include not only thermosetting resin but also thermoplastic resin and ceramics.

The connector 4 is provided on the surface of the multi-layer board 20a. Through the connector 4, the multi-layer board 20a is connected to the first sensor 1 through the third sensor 3 as external circuits. The connector 4 includes terminals PIN1 through PIN3. Tips of the terminals PIN1 through PIN3 are connected to lands provided on the surface of the multi-layer board 20a. The lands are connected to the wiring pattern 8a on the top layer, the wiring pattern 8b on the internal layer, and the wiring pattern 8c on the bottom layer.

The land may need to be connected to the wiring pattern 8b of the internal layer or 8c of the bottom layer. The wiring patterns 8a through 8C may need to be connected to each other across the layers. Accordingly, for the purposes of connecting to the wiring pattern, a laser can be used to form a via hole and to apply a copper plating process to the inside of the via hole to deposit copper, for example. The above described technique can electrically connect the wiring patterns 8a through 8c with each other that are formed at specified positions of different layers. The inter-layer connection may be provided not only by performing a plating process but also by filling conductive paste in the via hole.

The top and bottom surfaces of the multi-layer board 20a are provided with the resist films 6 and 7, respectively. The resist films 6 and 7 protect and insulate the wiring patterns 8a and 8c formed on the top and bottom surfaces. The surface of the multi-layer board 20a is mounted with electronic parts 10a, 10c, and 12c. The bottom layer is mounted with electronic parts 11a, 11c, and 12a. The internal layer contains electronic parts 10b, 11b, and 12b. Similarly to the example in FIG. 11A and FIG. 11B, the electronic parts filter, amplify, or analog-to-digital convert signals supplied from the first sensor 1 through the third sensor 3. The microcomputer may perform a specified operation based on the sensor signals.

The multi-layer electronic part built-in board 20a according to the invention differs from the multi-layer board 20 as shown in FIG. 11A and FIG. 11B as follows. The multi-layer electronic part built-in board 20a includes at least one electronic part belonging to the electronic parts 10a through 11c, 11a through 11c, and 12a through 12c connected to the first sensor 1 through the third sensor 3. More specifically, the multi-layer electronic part built-in board 20a is configured so that the top and bottom layers of the multi-layer board 20a are mounted with the electronic parts 10a, 11a, and 12a directly connected to the terminals PIN1 through PIN3 of the connector 4, making it possible to ensure at least one of the electronic parts 10a, 11a, and 12a mounted on the top and bottom layers for the first sensor 1 through the third sensor 3.

When at least one of the first sensor 1 through the third sensor 3 connected is changed to another having a different characteristic, it is possible to easily change only one of the electronic parts 10a, 11a, and 12a mounted on the top and bottom surfaces correspondingly to those sensors. When at least one of the sensors is changed as mentioned above, it is possible to easily change a filter circuits time constant or an amplifier circuit's amplification, for example. As a result, the same multi-layer electronic part built-in board 20a can be used to process inputs from the sensors having different characteristics. The multi-layer electronic part built-in board 20a therefore is quite versatile and can be used in different applications.

In principle, the example in FIG. 1A and FIG. 1B mounts the top and bottom layers of the multi-layer board 20a with the electronic parts 10a, 11a, and 12a directly connected to the terminals PIN1 through PIN3 of the connector 4. The above described configuration is used for the following reason. When at least one of the first sensor 1 through the third sensor 3 is changed to another having a different characteristic, it is often most effective to change the electronic part 10a, 11a, or 12a directly connected to that sensor via the connector 4.

Second Embodiment

A multi-layer electronic part built-in board 20b according to a second embodiment of the invention will now be described with reference to FIG. 2A and FIG. 2B. FIG. 2A shows a circuit using multiple electronic parts on and in a multi-layer board 20b for connection with a second sensor 2. FIG. 2B shows how the electronic parts in FIG. 2A are used on and in the multi-layer board 20b.

As shown, the circuit connected to the second sensor 2 includes a filter circuit and an input processing circuit 15. The filter circuit includes a resistor 13 and a capacitor 14. The input processing circuit 15 A/D-converts a signal filtered by the filter circuit and performs the other specified input processes. The input processing circuit 15 may represent an LSI device included, for example, in a microcomputer.

The capacitor 14 included in the filter circuit is connected between a signal line from the second sensor 2 to the input processing circuit 15 and a ground (GND). As shown in FIG. 2B, the multi-layer board 20b includes a ground wiring pattern 9a as one of the conductive layers. The ground wiring pattern 9a specifies ground potentials for the parts and circuits formed on the multi-layer board 20b. The ground wiring pattern 9a is connected to a terminal as a ground potential in the connector 4. A potential of the ground wiring pattern 9a is fixed to the ground potential.

The embodiment provides the ground wiring pattern 9a formed in the multi-layer board 20b with the electronic part such as capacitor 14, connected between the signal line and the ground.

The capacitor 14 is connected to both the signal line and the ground. The capacitor 14 can be provided for any of a wiring layer for forming a signal wiring pattern 8c as the signal line and a ground layer for forming the ground wiring pattern 9a.

It will be appreciated that a need may arise for miniaturizing the multi-layer board 20b and provide dense packaging for various electronic parts on the multi-layer board 20b. A typical solution to address the dense part packaging and placement is to provide dense packaging for the wiring patterns 8a through 8c on the wiring layer that transmit signals from the first sensor 1 through the third sensor 3 as examples of electronic parts. As wiring density increases, placing electronic parts on the wiring layer becomes more difficult. However, ensuring a region for placing electronic parts accordingly increases the board area size. Therefore, some electronic parts can be placed on the wiring layer and also the ground layer where the ground wiring pattern 9a is formed. Placing such electronic parts on the ground layer can increase the number of electronic parts that can be placed on the wiring layer without increasing the board area.

Third Embodiment

A multi-layer electronic part built-in board 20c according to a third embodiment of the invention will be described with reference to FIG. 2A, FIG. 2B, FIG. 3A, and FIG. 3B.

As shown, for example, in FIG. 3A, the multi-layer electronic part built-in board 20c for connection with the second sensor 2 includes a pull-up resistor 16 and a bypass capacitor 17 that are additions to the multi-layer electronic part built-in board 20b of the second embodiment. The pull-up resistor 16 is connected between the power supply and the signal line. The bypass capacitor 17 is used for stabilizing a power supply for the input processing circuit 15, for example.

The following describes an embodiment for building the additional parts in the multilayer board 20c.

Figure 3B:
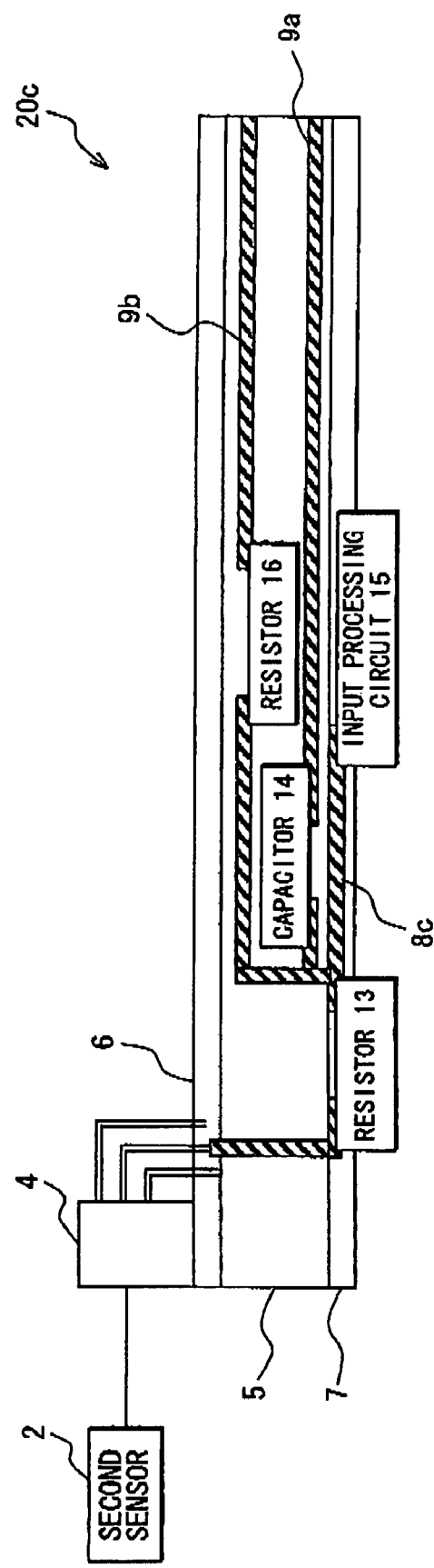
FIG. 3B is a diagram illustrating the electronic parts shown in FIG. 3A built on surface layers and in an internal layer of an exemplary multi-layer board.

As shown in FIG. 3B, the pull-up resistor 16 is provided for a power supply layer where a power supply wiring pattern 9b is formed. The pull-up resistor 16 is connected to both the signal line and the power supply. Therefore, the pull-up resistor 16 can be provided for any of the wiring layer for forming a signal wiring pattern 18c as the signal line and the power supply layer for forming the power supply wiring pattern 9b. For the same reason as providing the capacitor 14 for the ground layer, it is preferable to provide the pull-up resistor 16 for the power supply layer.

The following description includes how to provide the capacitor 14 for the ground layer and the pull-up resistor 16 for the power supply layer. As shown in FIG. 3B, the ground wiring pattern 9a and the power supply wiring pattern 9b are provided adjacent to each other in a layering direction of the multi-layer board 20c. The capacitor 14 is provided for both sides of the ground layer opposite the power supply layer. The resistor 16 is provided for both sides of the power supply layer opposite the ground layer. It should be noted that the capacitor 14 and the resistor 16 are displaced in a planar direction of the multi-layer board 20c so that they are not stacked, for example, in the layering direction. Such a configuration can prevent the thickness of the multi-layer board 20c from increasing while providing the ground layer and the power supply layer with the capacitor 14 and the resistor 16, respectively.

Figure 4A:
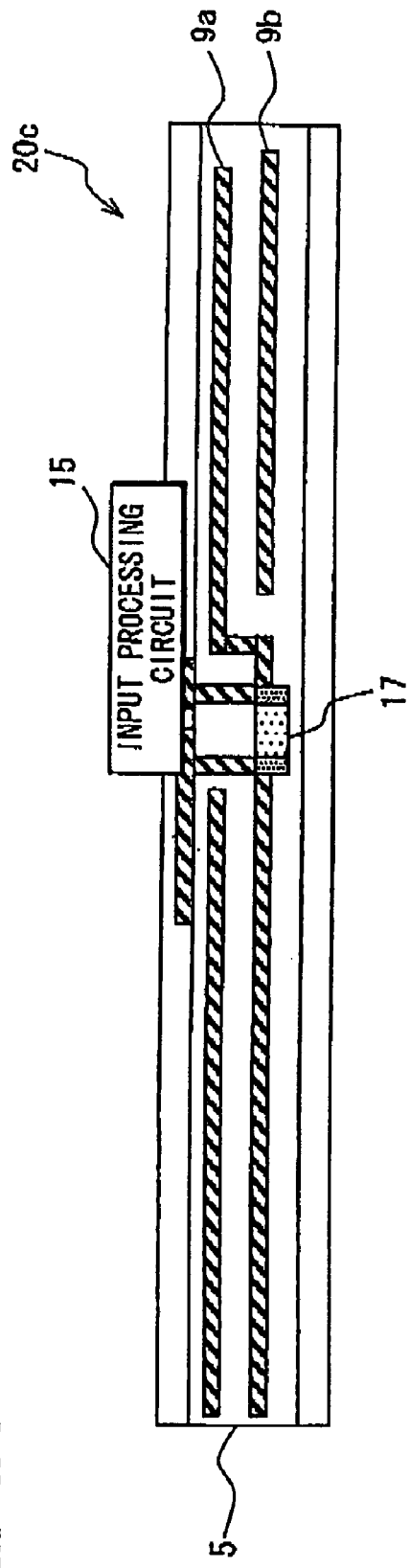
FIG. 4A is a diagram illustrating a structure and placement of an exemplary bypass capacitor according to a third embodiment.

The bypass capacitor 17 is connected to the input processing circuit 15. As shown in FIG. 4A, the bypass capacitor 17 is provided for the power supply wiring pattern 9b for forming the power supply layer. The bypass capacitor 17 makes inter-layer connection between a land connected to a power supply terminal of the input processing circuit 15 and a power supply side of the bypass capacitor 17. The bypass capacitor 17 makes interlayer connection between a land connected to a ground terminal of the input processing circuit and a ground side of the bypass capacitor 17. The ground side of the bypass capacitor 17 is also connected to the ground wiring pattern 9a of the multi-layer board 20c.

Figure 4B:
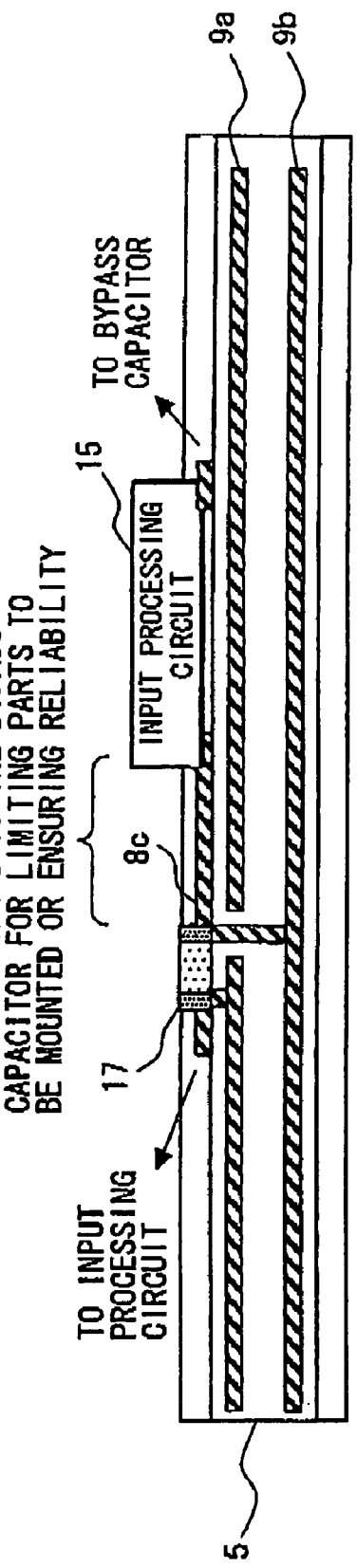
FIG. 4B is a diagram illustrating a comparative example of a different placement of a bypass capacitor.

As shown in FIG. 4B, for example, the bypass capacitor 17 may be provided for the wiring pattern 8c, which is also used for placing the input processing circuit 15. It should be noted that a specified space is needed between the input processing circuit 15 and the bypass capacitor 17 in order to limit the number of parts to be mounted or to ensure reliability. While the specified space establishes a distance between the input processing circuit 15 and the bypass capacitor 17, the specified space also establishes an impedance. Thus, for example, if the space is increased or decreased, the impedance will also increase or decrease respectively.

By contrast, the configuration as shown in FIG. 4A can minimize a distance and thus an amount of wiring between the input processing circuit 15 and the bypass capacitor 17. As a result, the bypass capacitor 17 can be connected to the input processing circuit 15 with a relatively low impedance compared to that associated with a greater distance.

Fourth Embodiment

Figure 5:
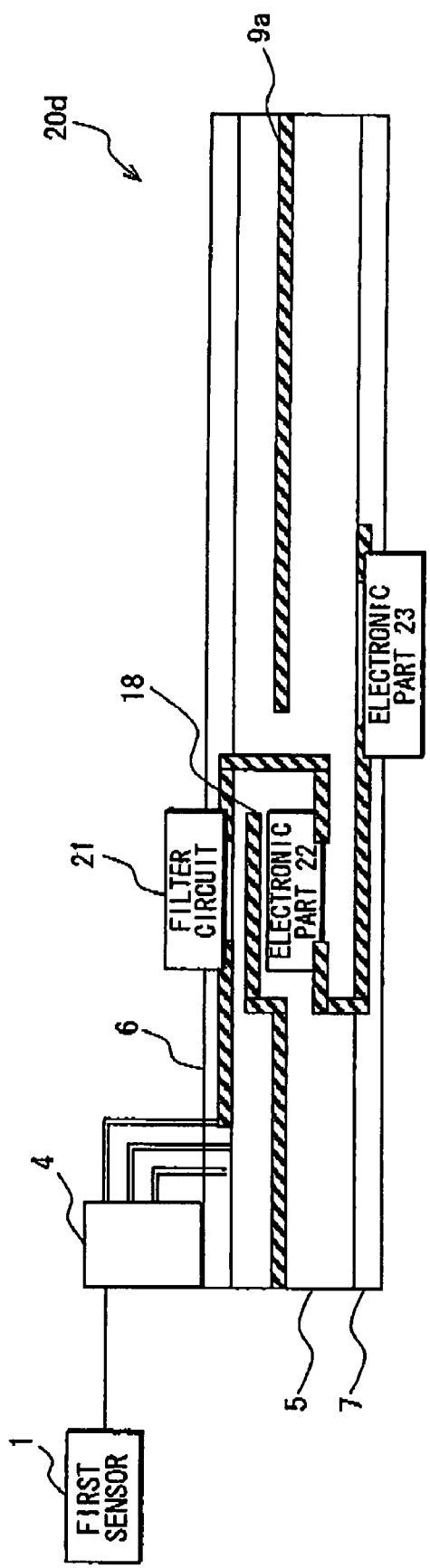
FIG. 5 is a diagram illustrating an exemplary structure of a multi-layer electronic part built-in board according to a fourth embodiment.

A multi-layer board 20d according to a fourth embodiment, for example as shown in FIG. 5, has a filter circuit 21 on the top layer of the multi-layer board 20b correspondingly to the first sensor 1. An electronic part 22 connected to the filter circuit 21 is contained in the multi-layer board 20d. A subsequent electronic part 23 is mounted on the bottom layer.

According to the illustrated configuration, the filter circuit 21 eliminates signal components associated with undesired or unnecessary frequency bands from an output signal from the first sensor 1 and allows only a signal of a specified frequency band to pass. Therefore, the electronic parts 22 and 23 subsequent to the filter circuit 21 can be supplied with a sensor signal whose noise is removed from a filtering process.

It should be noted that, as the state of the art in high-density packaging develops, the multi-layer board 20d may be further configured to contain the electronic part 22 or a similar electronic part immediately below the filter circuit 21. Since the filter circuit 21 is supplied with an unfiltered signal that may contain many noise signal components, noise signals may be inadvertently coupled into the immediately underlying built-in electronic part 22 from the filter circuit 21. To solve the above described problem, the present embodiment provides a shield pattern 18 between the filter circuit 21 and the electronic part 22. The shield pattern 18 can be made of a conductor such as a copper foil in order to prevent the noise signal components from being transmitted or otherwise electrically coupled from the filter circuit 21 into the electronic part 22.

It should also be noted that, as shown in FIG. 5, the shield pattern 18 according to the present embodiment is connected to the ground wiring pattern 9a. Accordingly, when noise signal components enter the shield pattern 18, the noise is immediately transferred to the ground wiring pattern 9a, thus more effectively preventing noise.

Fifth Embodiment

Figure 6:
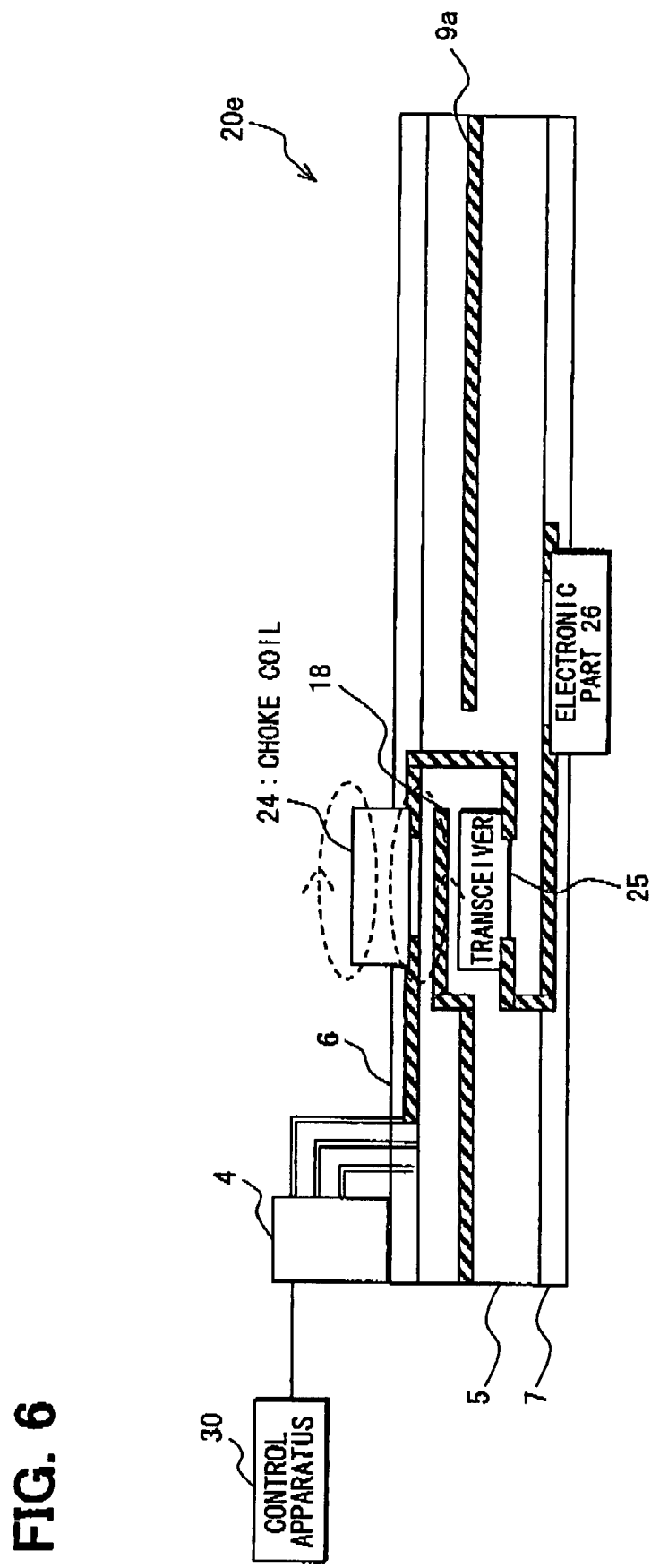
FIG. 6 is a diagram illustrating an exemplary structure of a multi-layer electronic part built-in board according to a fifth embodiment.

The multi-layer electronic part built-in board 20e according to a fifth embodiment, to be described herein with reference for example to FIG. 6, connects with one or more control apparatus 30, which can be provided, for example, as external circuits. A choke coil 24 is mounted on the top layer of the multi-layer board 20e. A transceiver IC 25 is built in the multi-layer board 20e. The choke coil 24 and the transceiver IC 25 form a communication circuit for the multi-layer board 20e. An electronic part 26 is mounted on the bottom layer of the multi-layer board 20e.

The choke coil 24 attenuates common mode noise in a local area network that is formed along with the other communication circuits. In addition, the choke coil 24 allows passing of a communication signal that is transmitted in a differential mode.

The transceiver IC 25 uses the choke coil 24 to receive a communication signal having attenuated common mode noise. The transceiver IC 25 also transmits a communication signal in the differential mode to the other communication circuits.

The choke coil 24 is structured to easily generate a magnetic field and easily causes the magnetic field to influence peripheral parts. When the choke coil 24 is mounted on the surface of the multi-layer board 20e, for example, the choke coil 24 generates a magnetic field as indicated by a broken line in FIG. 6. It will be noted, as shown in the figure, that in some cases the transceiver IC 25 may need to be placed immediately under or near the choke coil 24, thus causing the transceiver IC 25 to come under the influence of a magnetic field emanating from the choke coil 24.

Therefore, in such case, it is also effective to provide the shield pattern 18 as described in association with the fourth embodiment. Providing the shield pattern 18 between the choke coil 24 and the transceiver IC 25 can prevent a magnetic field acting on the transceiver IC 25 from the choke coil 24.

Sixth Embodiment

Figure 7:
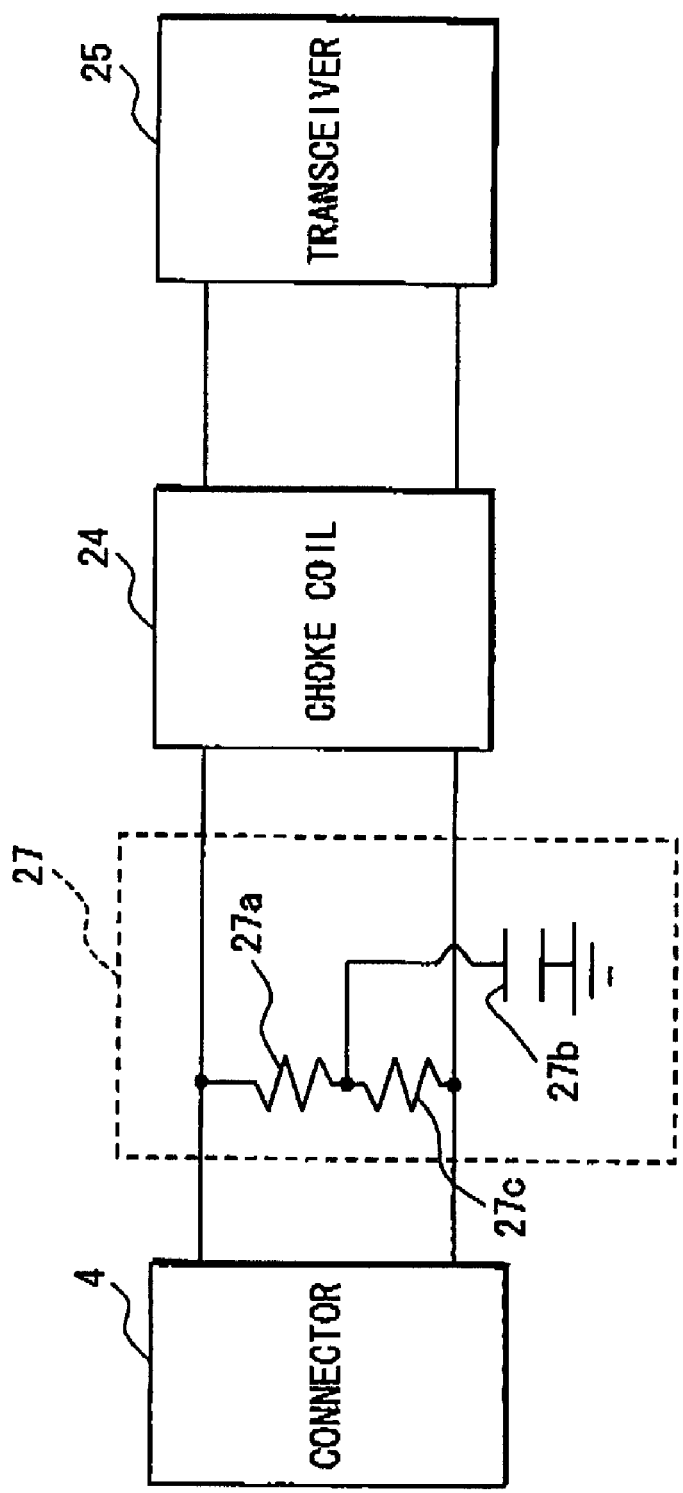
FIG. 7 is a diagram illustrating an exemplary structure of a multi-layer electronic part built-in board according to a sigh embodiment.

A sixth embodiment of the invention can also be described with reference to FIG. 6. As mentioned above in accordance with the fifth embodiment, the communication circuit formed on the multi-layer board 20e may form a local area network along with, for example, the other communication circuits for the control apparatus 30. Generally, a communication circuit can be defined as a node or a terminal in the local area network. The communication circuit is provided with a terminal circuit including a terminal resistor such as an exemplary terminal circuit 27 provided between the connector 4 and the choke coil 24 as shown in FIG. 7. The terminal circuit 27 includes terminal resistors resistor 27a and 27c and a capacitor 27b.

It will be appreciated that the terminal resistors 27a and 27c prevent a signal from being reflected at a local area network terminal and consequently prevent disorder of signals in the network, particularly where no circuit is attached, for example, to connector 4. It will further be appreciated that not all communication circuits are necessarily provided with the terminal circuit 27 including the terminal resistors 27a and 27c. In particular, those communication circuits with external circuits attached may not require a terminal circuit 27. Accordingly, the terminal circuit 27 is mounted on the top and bottom surfaces of the multi-layer board 20e and can be mounted or detached as needed.

The common multi-layer board 20e can be used to configure the communication circuit or the control apparatus 30 independently of whether the terminal circuit 27 is required.

Seventh Embodiment

A multi-layer electronic part built-in board according to a seventh embodiment of the invention will be described hereinafter with reference to FIG. 8.

As described in the second to fifth embodiments, the multi-layer board may be provided with the ground layer including the ground wiring pattern 9a. In such case, it is preferable to determine a mode of the ground wiring pattern 9a depending on the type of a circuit formed on the multi-layer board.

For example, the multi-layer board may use a power circuit such as large current circuit, that needs to be supplied with a large drive current for driving an external load. In the present case, the ground wiring pattern 9a of the ground layer is divided into a power ground 9a1 and a signal ground 9a2 for a normal signal processing circuit. Such a configuration can prevent noise generated from a power circuit from entering the signal processing circuit, via the ground wiring pattern 9a.

It should be noted that noise generated by the above-mentioned power circuit generally contains relatively low-frequency components that have minimal effect in causing a ground potential to be unstable. Even when the ground wiring pattern 9a of the ground layer is divided into the power ground 9a1 and the signal ground 9a2, low-frequency noise components have little effect. When the multi-layer board is also provided with a high-frequency oscillation circuit, the undivided ground wiring pattern 9a keeps a ground potential stable against high-frequency noise components generated from the high-frequency oscillation circuit.

The capacitor 28a is used to connect the divided set of the power ground 9a1 and the signal ground 9a2 with each other when the multi-layer board includes the high-frequency oscillation circuit or a similar circuit that can be a source of high-frequency noise. The power ground 9a1 and the signal ground 9a2 become electrically conductive via the capacitor 28a, keeping the ground potential stable even when high-frequency noise occurs.

When the multi-layer board includes a relatively low-frequency dock circuit, noise may enter the signal ground 9a2 for the signal processing circuit from a low-frequency dock circuit ground 9a3 equivalent to the ground wiring pattern for the clock circuit. To mitigate or prevent the noise, a slit is provided between the low-frequency clock circuit ground 9a3 and the signal ground 9a2. As shown in FIG. 8, a filter including an inductor and a capacitor is inserted into a junction between the low-frequency clock circuit ground 9a3 and the signal ground 9a2. The filter can attenuate, reflect or otherwise mitigate noise due to, for example, the low-frequency clock.

As mentioned above, joining the divided ground wiring pattern 9a can keep the ground potential stable against high-frequency noise. A capacitor 28b is used to connect the low-frequency clock circuit ground 9a3 with the signal ground 9a2 at both sides of the slit. The capacitor 28b makes the low-frequency dock circuit ground 9a3 and the signal ground 9a2 electrically conductive against high-frequency noise signals.

As described in association with the third embodiment, the multi-layer board may have the ground layer including the ground wiring pattern 9a and the power supply layer including the power supply wiring pattern 9b. The multi-layer board may contain a capacitor 28c for connecting the power supply layer with the ground layer. When the capacitor 28c is built in, it is possible to minimize a distance from the capacitor 28c to the power supply layer and the ground layer. The capacitor 28c can be used to thereby to stabilize the power supply and decrease an impedance as a result of minimizing the length of the wiring required to connect the layers . . . .

Figure 8:
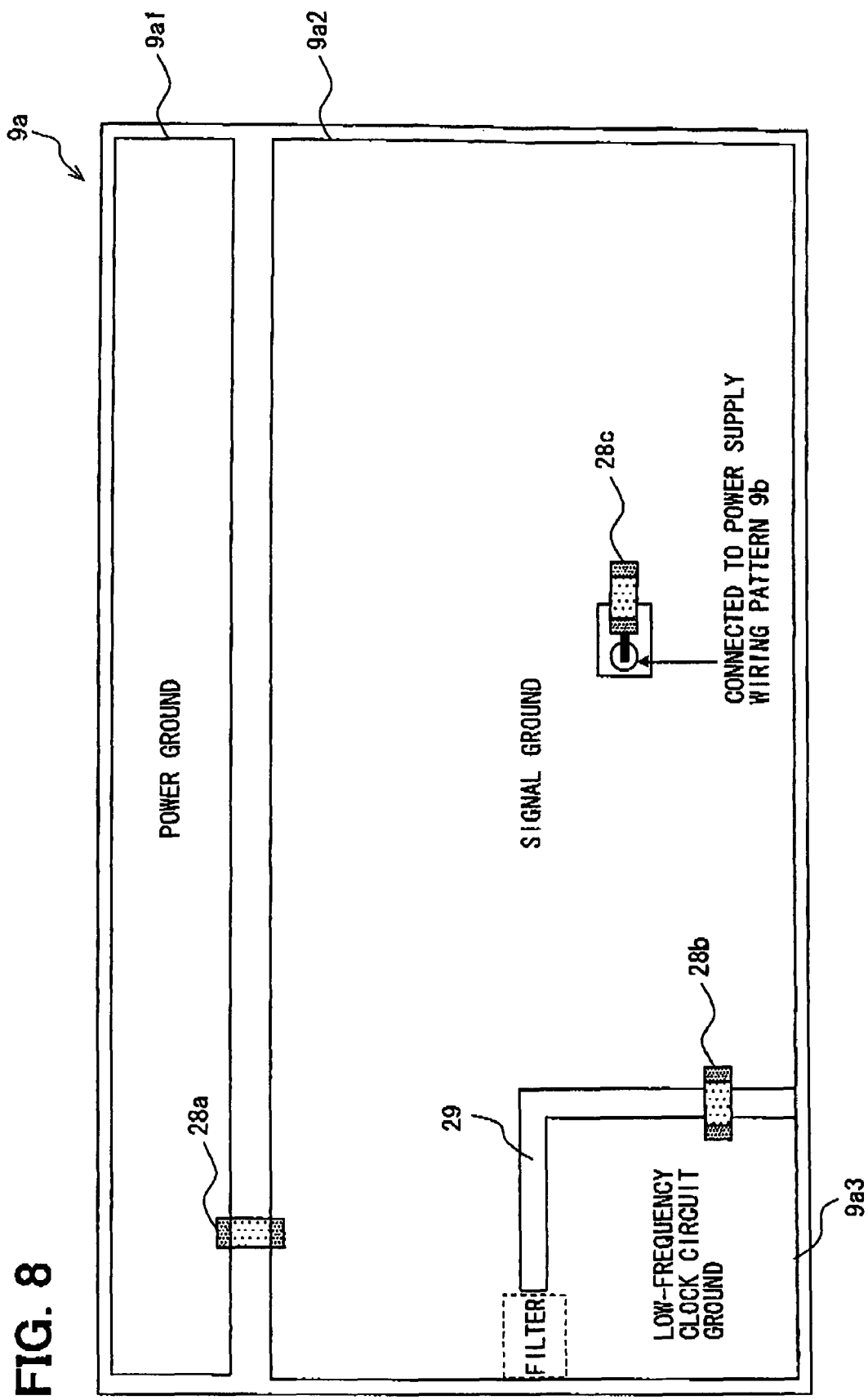
FIG. 8 is a diagram illustrating an exemplary structure of a multi-layer electronic part built-in board according to a seventh embodiment.

The capacitor 28c may be provided as shown for connecting on the side of the multilayer board having the ground wiring pattern 9a as shown in FIG. 8 and connecting to the power supply wiring pattern 9b or can be for connecting on the side of the power supply wiring pattern 9b and connecting to the ground wiring pattern 9b.

The ground wiring pattern 9a may be provided with multiple electronic parts such as capacitors, resistors, and diodes. Though not shown in FIG. 8, the ground wiring pattern 9a of the ground layer should be provided between the electronic parts.

The ground wiring pattern 9a may have a hole for connecting the electronic parts for the ground wiring pattern 9a with the wiring layer and the power supply layer, for example, through via holes. The hole becomes bigger as the number of electronic parts increases. The hole bottlenecks a path for a current flowing to the ground wiring pattern 9a. The current may need to take a long detour. When electronic parts are provided for the ground wiring pattern 9a, it is preferable to avoid making a continuous large hole in the ground wiring pattern 9a. Instead, the ground wiring pattern 9a is provided between the electronic parts so that each part has its own hole independent of the others making it possible to shorten the route for a current flowing to the ground wiring pattern 9a.

Eighth Embodiment

Figure 9:
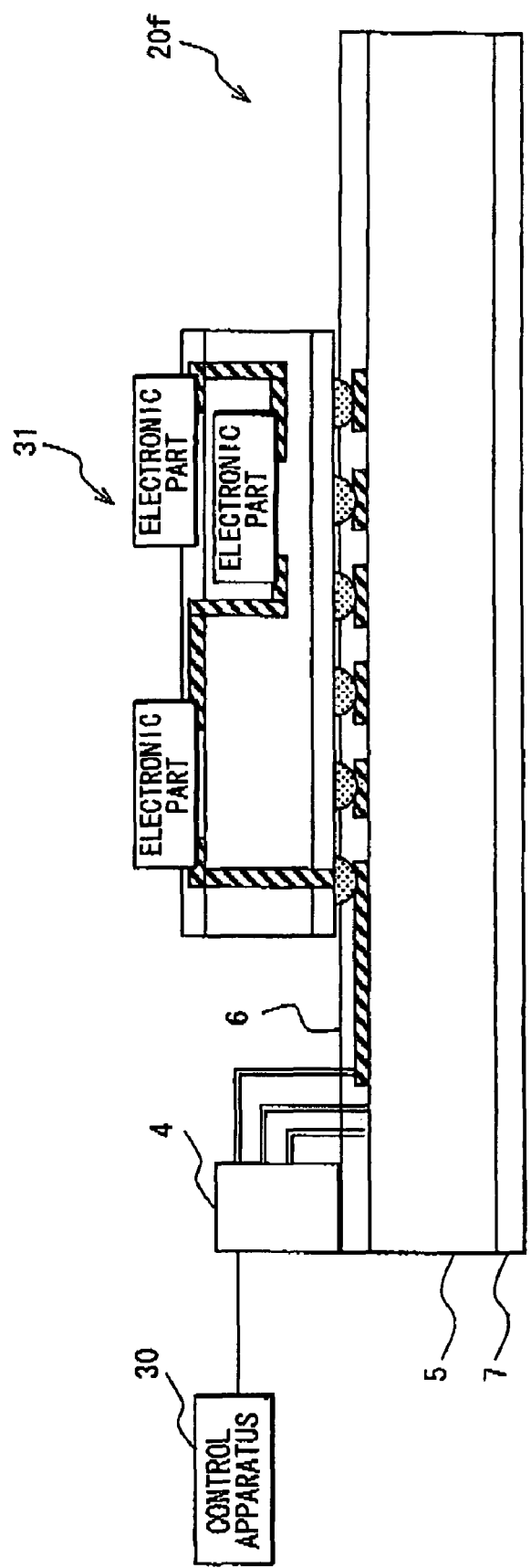
FIG. 9 is a diagram illustrating an exemplary structure of a multi-layer electronic part built-in board according to an eighth embodiment.

A multi-layer electronic part built-in board according to an eighth embodiment of the invention will now be described with reference to FIG. 9.

The above-mentioned first through seventh embodiments have described the examples of using the multi-layer electronic part built-in board for a mother board that is mounted or embedded with various electronic parts including ICs and LSIs. As shown in FIG. 9, an internal structure of the multi-layer board described in the first through seventh embodiments may be applied to that of a module device mounted on the mother board.

For example, a yield may decrease when a large-sized mother board is structured in compliance with the multi-layer board according to the above-mentioned embodiments. To solve the above described problem, the multilayer board structures according to the embodiments are applied to not the mother board, but a module device provided for it making it possible to miniaturize the mother board and prevent a yield from decreasing.

In particular, in accordance with the fifth and sixth embodiments the communication circuit for communicating with the control apparatus 30 is formed by having the communication circuit as an external circuit. In such case, the communication circuit can be modularized, that is, can be formed as a module device and thus can be separated from the circuit configuration of the mother board. Accordingly, the circuit formed on the mother board is less susceptible to effects from, for example, noise emitted from the communication circuit and the communication circuit is less susceptible to effects, such as noise or crosstalk from the other circuits on the mother board.

(Modifications)

While specific embodiments of the present invention have been described herein, it is to be understood that the present invention is not limited thereto but may be variously embodied within the spirit and scope of the invention.

Figure 10A:
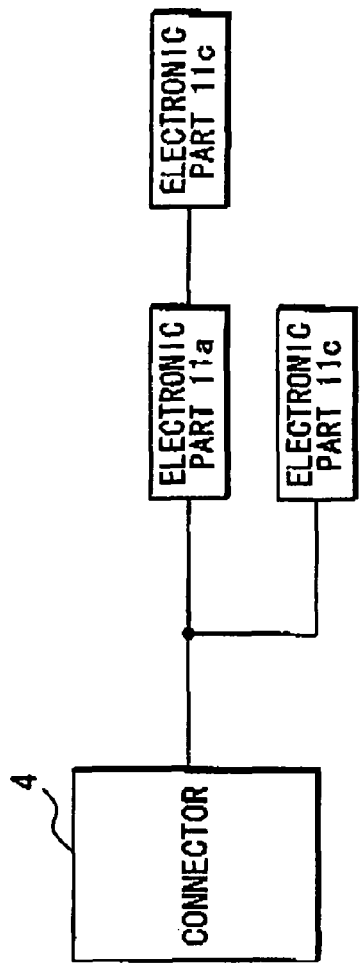
FIG. 10A is a block diagram illustrating an exemplary circuit associated with a multi-layer electronic part built-in board according to a modified embodiment.
Figure 10B:
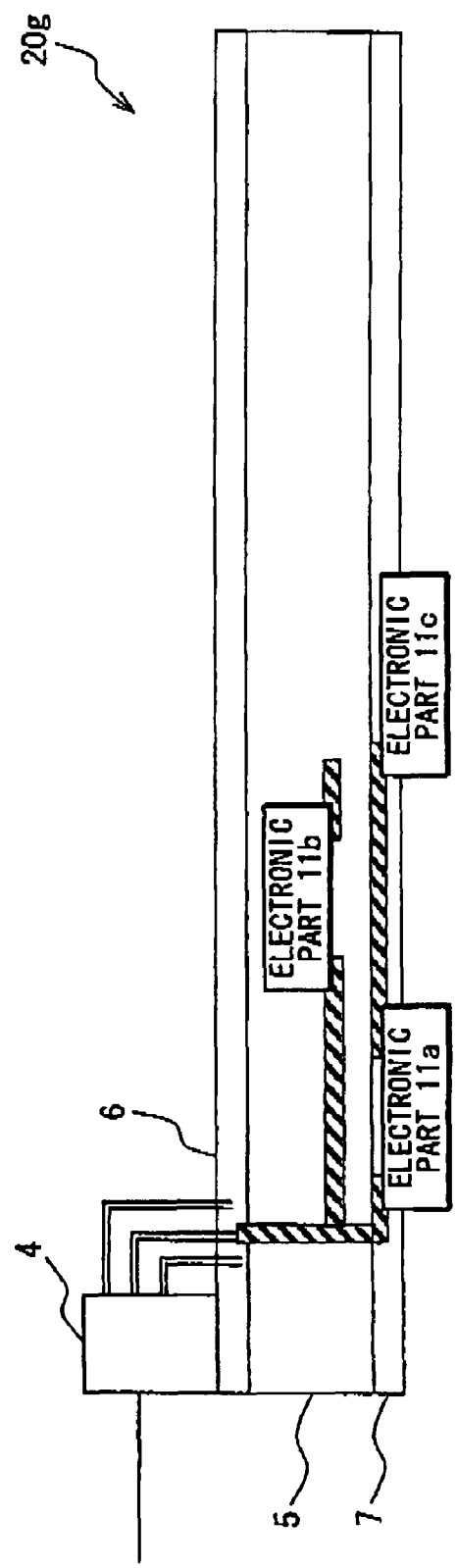
FIG. 10B is a diagram illustrating the electronic parts shown in FIG. 10A built on surface layers and in an internal layer of an exemplary multi-layer board.

For example, as shown in FIG. 10A and FIG. 10B, a part such as an electronic part 11b can be directly connected to the connector 4 through, for example, a branch circuit of the signal line. If electronic part 11b does not require change when the external circuit is changed, the electronic part 11b may be built in the multi-layer board 20g.

Further, in accordance with, for example, the seventh embodiment, a ground wiring pattern 9a corresponding to types of circuits formed on the multi-layer board is provided. In an exemplary modified embodiment, such wiring pattern can be effectively applied to not only the ground wiring pattern 9a but also the power supply wiring pattern 9b. Accordingly, various embodiments or modes described in connection with the ground wiring pattern 9a may be directly used in connection with embodiments or modes associated with the power supply wiring pattern 9b.

What is claimed is:

1. A multi-layer electronic part built-in board including a conductive layer and an insulating layer that are alternately arranged, the multi-layer board comprising:
    a top layer, a bottom layer and an internal layer, the internal layer configured to contain a first at least one of a plurality of electronic parts; and
    a connector having a plurality of connection lines for connecting with a plurality of external circuits, ones of the plurality of connection lines electrically connecting an electronic part group including the first at least one and a second at least one of the plurality of electronic parts to corresponding ones of the plurality of external circuits, wherein
    the second at least one of the plurality of electronic parts is mounted on one of the top layer and the bottom layer,
    the second at least one of the plurality of electronic parts includes a filter part for allowing only a signal of a specified frequency band to pass, and
    a layer having a shield pattern is defined between the filter part and the first at least one of the plurality of electronic parts to restrict interference of a signal from the filter part to the first at least one of the plurality of electronic parts.

2. The multi-layer electronic part built-in board of claim 1, wherein
    the second at least one of the plurality of electronic parts is directly connected to the connector and the first at least one of the plurality of electronic parts is connected to the connector via the second at least one of the plurality of electronic parts.

3. The multi-layer electronic part built-in board of claim 1, wherein
    the filter part includes a common mode choke coil.

4. The multi-layer electronic part built-in board of claim 1, wherein:
    a second one of the top layer and the bottom layer includes a ground layer for specifying a ground potential; and
    the shield pattern is connected to the ground layer.

5. An electronic apparatus having a multi-layer electronic part built-in board including a conductive layer and an insulating layer that are alternately arranged, the apparatus comprising:
    a top layer, a bottom layer and an internal layer configured to contain a first at least one of a plurality of electronic parts, the conductive layer including a top layer and a bottom layer; and
    a connector having a plurality of connection lines for connecting with a plurality of external circuits, each of the plurality of connection lines electrically connecting an electronic part group with corresponding ones of the plurality of external circuits, wherein
    a second at least one of the plurality of electronic parts in the electronic part group is mounted on one of the top layer and the bottom layer,
    the second at least one of the plurality of electronic parts includes a bandpass filter, and
    a layer having a shield pattern is defined between the bandpass filter and the first at least one of the plurality of electronic parts to restrict interference of a signal from the filter part to the built-in electronic part.

6. The electronic apparatus of claim 5, wherein
    the second at least one of the plurality of electronic parts is connected directly to the connector and the first at least one of the plurality of electronic parts is connected to the connector via the second at least one of the plurality of electronic parts.

7. The electronic apparatus of claim 6, wherein:
    one of the top layer and the bottom layer includes a ground layer and the other of the top layer and the bottom layer includes a power supply layer, the ground layer provided adjacent to the power supply layer;
    the second at least one of the plurality of electronic parts is provided on the ground layer opposite the power supply layer;
    a third at least one of the plurality of electronic parts is provided on the power supply layer opposite the ground layer; and
    the second at least one of the plurality of electronic parts and the third at least one of the plurality of electronic parts are located at displaced positions in a layering direction of the multi-layer board.

* * * * *